(12) United States Patent
Lee et al.

(10) Patent No.: US 11,543,863 B2
(45) Date of Patent: Jan. 3, 2023

(54) PORTABLE ELECTRONIC DEVICE AND IMAGE-CAPTURING MODULE THEREOF

(71) Applicant: AZUREWAVE TECHNOLOGIES, INC., New Taipei (TW)

(72) Inventors: Tseng-Chieh Lee, New Taipei (TW); Kung-An Lin, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 232 days.

(21) Appl. No.: 17/031,861

(22) Filed: Sep. 24, 2020

(65) Prior Publication Data

US 2022/0026963 A1 Jan. 27, 2022

(30) Foreign Application Priority Data

Jul. 24, 2020 (TW) .................................. 109125024

(51) Int. Cl.
*G06F 1/16* (2006.01)
*H01L 27/146* (2006.01)
*G02B 13/00* (2006.01)

(52) U.S. Cl.
CPC ...... *G06F 1/1686* (2013.01); *H01L 27/14618* (2013.01); *H01L 27/14625* (2013.01); *H01L 27/14636* (2013.01); *G02B 13/001* (2013.01)

(58) Field of Classification Search
CPC ............. G06F 1/1686; H01L 27/14618; H01L 27/14625; H01L 27/14636; G02B 13/001
See application file for complete search history.

(56) References Cited

U.S. PATENT DOCUMENTS

| 6,429,511 B2 | 8/2002 | Ruby et al. |
| 7,916,212 B2 * | 3/2011 | Wu ................... H01L 27/14618 |
| | | 257/434 |
| 10,658,414 B1 | 5/2020 | Jin |

(Continued)

FOREIGN PATENT DOCUMENTS

| CN | 101010810 A | 8/2007 |
| CN | 208143325 U | 11/2018 |

(Continued)

*Primary Examiner* — Jonathan Han
(74) *Attorney, Agent, or Firm* — Li & Cai Intellectual Property Office

(57) ABSTRACT

A portable electronic device and an image-capturing module thereof are provided. The image-capturing module includes a circuit substrate, an image-capturing chip, a plurality of first conductive materials, a filter component, a plurality of second conductive materials, and a lens assembly. The circuit substrate includes a plurality of substrate bond pads. The image-capturing chip includes a plurality of chip bond pads. The first conductive materials are respectively disposed on the chip bond pads. The filter component is disposed on the first conductive materials, and the filter component includes a light-transmitting body and a plurality of conductive structures disposed on the light-transmitting body and respectively electrically connected to the first conductive materials. Each of the second conductive materials is electrically connected between the corresponding conductive structure and the corresponding substrate bond pads. The lens assembly is disposed on the circuit substrate so as to correspond to the image-capturing chip.

6 Claims, 12 Drawing Sheets

(56) References Cited

U.S. PATENT DOCUMENTS

| | | | |
|---|---|---|---|
| 2002/0090803 A1 | 7/2002 | Salaville | |
| 2006/0231750 A1* | 10/2006 | Chao | H01L 27/14618 |
| | | | 250/239 |
| 2006/0284215 A1* | 12/2006 | Maeda | H01L 27/14632 |
| | | | 257/434 |
| 2016/0191767 A1* | 6/2016 | Otani | G02B 7/08 |
| | | | 29/832 |
| 2018/0205858 A1* | 7/2018 | Tsuruoka | H01L 27/1462 |
| 2019/0229055 A1 | 7/2019 | So et al. | |
| 2019/0371833 A1* | 12/2019 | Hogyoku | H04N 5/2253 |

FOREIGN PATENT DOCUMENTS

| | | |
|---|---|---|
| JP | 2003163341 A | 6/2003 |
| JP | 2014132690 A | 7/2014 |
| KR | 1020190090180 A | 8/2019 |
| KR | 1020200069196 A | 6/2020 |
| TW | 201811014 A | 3/2018 |

\* cited by examiner

PORTABLE ELECTRONIC DEVICE AND IMAGE-CAPTURING MODULE THEREOF

CROSS-REFERENCE TO RELATED PATENT APPLICATION

This application claims the benefit of priority to Taiwan Patent Application No. 109125024, filed on Jul. 24, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device and a capturing module thereof, and more particularly to a portable electronic device and an image-capturing module thereof.

BACKGROUND OF THE DISCLOSURE

Currently, a portable electronic device is generally provided with an image-capturing module, and the conventional image-capturing module still has room for improvement.

SUMMARY OF THE DISCLOSURE

In response to the above-referenced technical inadequacies, the present disclosure provides a portable electronic device and an image-capturing module thereof.

In one aspect, the present disclosure provides an image-capturing module, including a circuit substrate, an image-capturing chip, a plurality of first conductive materials, a filter component, a plurality of second conductive materials, and a lens assembly. The circuit substrate includes a plurality of substrate bond pads. The image-capturing chip includes a plurality of chip bond pads. The first conductive materials are respectively disposed on the chip bond pads of the image-capturing chip. The filter component is disposed on the first conductive materials, and the filter component includes a light-transmitting body and a plurality of conductive structures disposed on the light-transmitting body and respectively electrically connected to the first conductive materials. Each of the second conductive materials is electrically connected between the corresponding conductive structure and the corresponding substrate bond pads. The lens assembly is disposed on the circuit substrate so as to correspond to the image-capturing chip.

In another aspect, the present disclosure provides a portable electronic device using an image-capturing module, and the image-capturing module includes a circuit substrate, an image-capturing chip, a plurality of first conductive materials, a filter component, a plurality of second conductive materials, and a lens assembly. The circuit substrate includes a plurality of substrate bond pads. The image-capturing chip includes a plurality of chip bond pads. The first conductive materials are respectively disposed on the chip bond pads of the image-capturing chip. The filter component is disposed on the first conductive materials, and the filter component includes a light-transmitting body and a plurality of conductive structures disposed on the light-transmitting body and respectively electrically connected to the first conductive materials. Each of the second conductive materials is electrically connected between the corresponding conductive structure and the corresponding substrate bond pads. The lens assembly is disposed on the circuit substrate so as to correspond to the image-capturing chip.

Therefore, by virtue of "the first conductive materials being respectively disposed on the chip bond pads of the image-capturing chip", "the filter component being disposed on the first conductive materials, and the filter component including a light-transmitting body and a plurality of conductive structures disposed on the light-transmitting body and respectively electrically connected to the first conductive materials" and "each of the second conductive materials being electrically connected between the corresponding conductive structure and the corresponding substrate bond pads", the filter component can not only be electrically connected to the chip bond pads of the image-capturing chip through the cooperation of the conductive structures and the first conductive materials, but can also be supported above the image-capturing chip by the first conductive materials that are respectively disposed on the chip bond pads.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
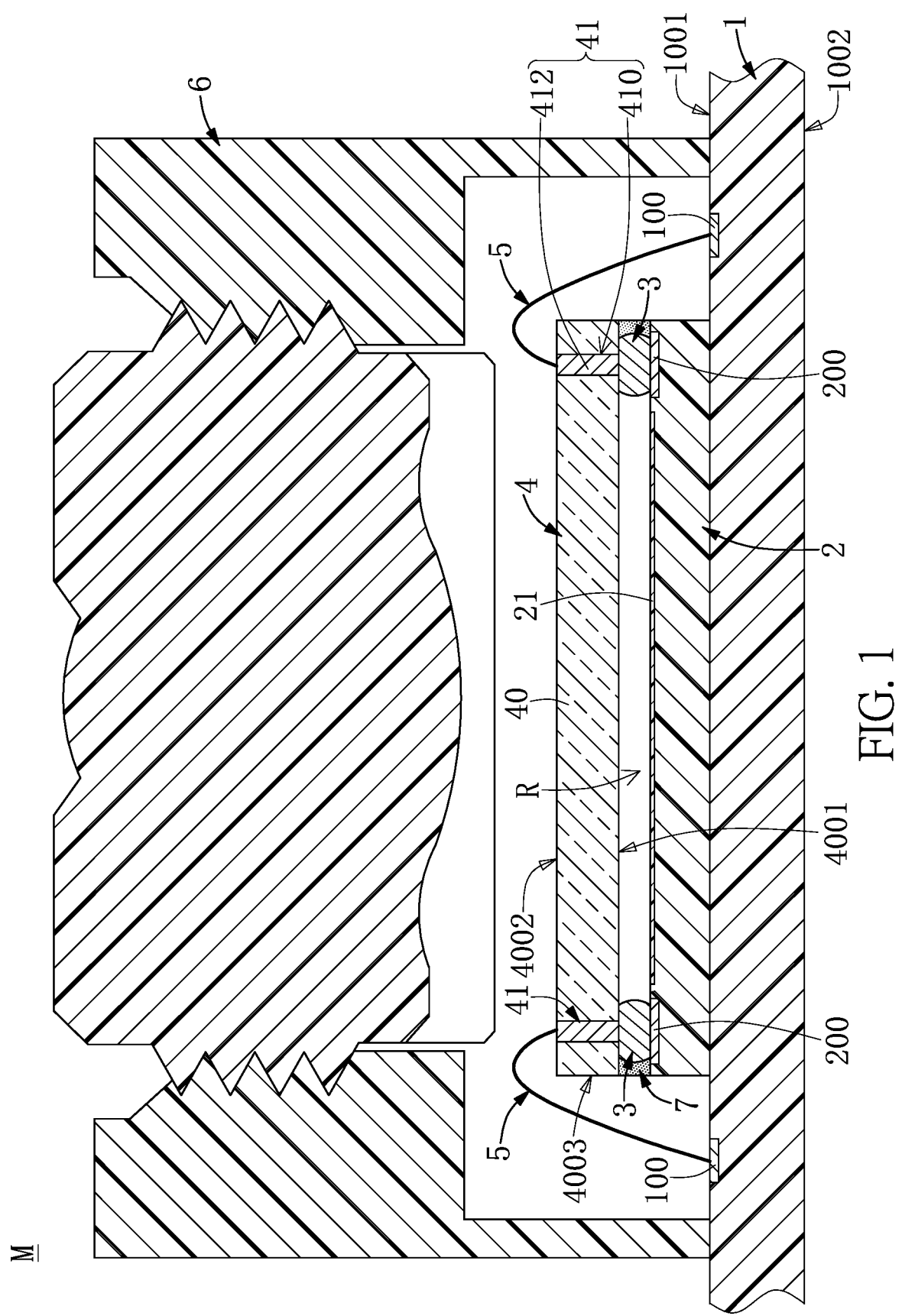
FIG. 1 is a lateral schematic view of an image-capturing module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
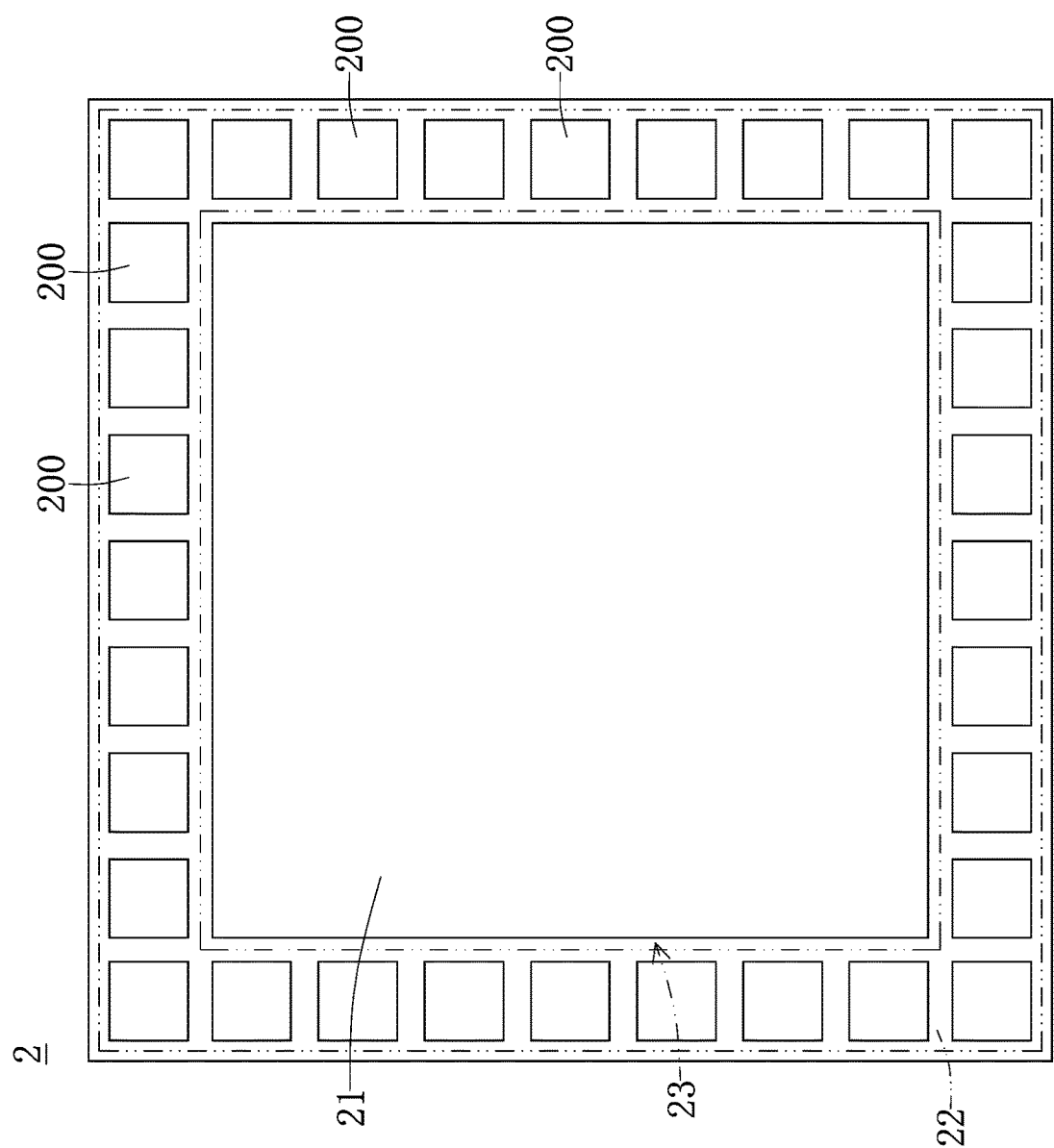
FIG. 2 is a top schematic view of an image-capturing chip according to the first embodiment of the present disclosure.

Referring to FIG. 1 and FIG. 2, a first embodiment of the present disclosure provides an image-capturing module M, including a circuit substrate 1, an image-capturing chip 2, a plurality of first conductive materials 3, a filter component 4, a plurality of second conductive materials 5, and a lens assembly 6. More particularly, the circuit substrate 1 includes a plurality of substrate bond pads 100 (such as solder pads), the image-capturing chip 2 includes a plurality of chip bond pads 200 (such as solder pads), and the first conductive materials 3 are respectively disposed on the chip bond pads 200 of the image-capturing chip 2. The filter component 4 is disposed on the first conductive materials 3. The filter component 4 includes a light-transmitting body 40 and a plurality of conductive structures 41 disposed on the light-transmitting body 40 and respectively electrically connected to the first conductive materials 3. Each of the second conductive materials 5 is electrically connected between the corresponding conductive structure 41 and the corresponding substrate bond pads 100, and the lens assembly 6 is disposed on the circuit substrate 1 so as to correspond to the image-capturing chip 2.

For example, as shown in FIG. 1, the circuit substrate 1 has a top surface 1001 and a bottom surface 1002 opposite to the top surface 1001, the image-capturing chip 2 can be disposed on the top surface 1001 of the circuit substrate 1, and the substrate bond pads 100 can be disposed on the top surface 1001 of the circuit substrate 1. In addition, each of the first conductive materials 3 may be a conductive body (such as solder ball, solder paste or any type of conductive material) electrically connected between the corresponding chip bond pad 200 and the corresponding conductive structure 41, and each of the second conductive materials 5 may be a conductive wire (such as a metal wire formed by wire bonding method) electrically connected between the corresponding conductive structure 41 and the corresponding substrate bond pad 100. However, the aforementioned description is merely an example and is not meant to limit the scope of the present disclosure.

For example, as shown in FIG. 1, each of the conductive structures 41 of the filter component 4 (such as an optical filter) includes a through hole 410 passing through the light-transmitting body 40 and a conductive penetration layer 412 disposed inside the through hole 410 (so that the through hole 410 can be fully filled by the conductive penetration layer 412), and the conductive penetration layer 412 has two opposite ends respectively electrically contacting the corresponding first conductive material 3 and the corresponding second conductive material 5. However, the aforementioned description is merely an example and is not meant to limit the scope of the present disclosure.

For example, referring to FIG. 1 and FIG. 2, the image-capturing chip 2 may be a complementary metal-oxide-semiconductor (CMOS) chip or a charge-coupled device (CCD). In addition, the image-capturing chip 2 has an image-sensing region 21 and a chip pad region 22 for carrying pads, and an unoccupied region 23 (or an unoccupied space) is located between the image-sensing region 21 and the chip pad region 22. That is to say, the filter component 4 can be supported by the first conductive materials 3, and there is not any support body disposed on the unoccupied region 23 (that is a surrounding slot region located between the image-sensing region 21 and the surrounding chip pad region 22) for supporting the filter component 4, so that a sensing area of the image-sensing region 21 can be increased or maximized due to the unoccupied region 23 that is minimized. Moreover, the chip bond pads 200 are disposed on the chip pad region 22, and the image-sensing region 21 is surrounded by the chip pad region 21, so that the image-sensing region 21 can be surrounded by the chip bond pads 200. However, the aforementioned description is merely an example and is not meant to limit the scope of the present disclosure.

For example, as shown in FIG. 1, it should be noted that the image-capturing module M further includes an insulating filling material 7, and the insulating filling material 7 can be disposed between the image-capturing chip 2 and the filter component 4 for surrounding the first conductive materials 3 so as to form an enclosed space R between the image-capturing chip 2 and the filter component 4. Therefore, the insulating filling material 7 can be used to prevent the chip pad region 21 of the image-capturing chip 2 from being polluted by external particles or dust. However, the aforementioned description is merely an example and is not meant to limit the scope of the present disclosure.

Figure 3:
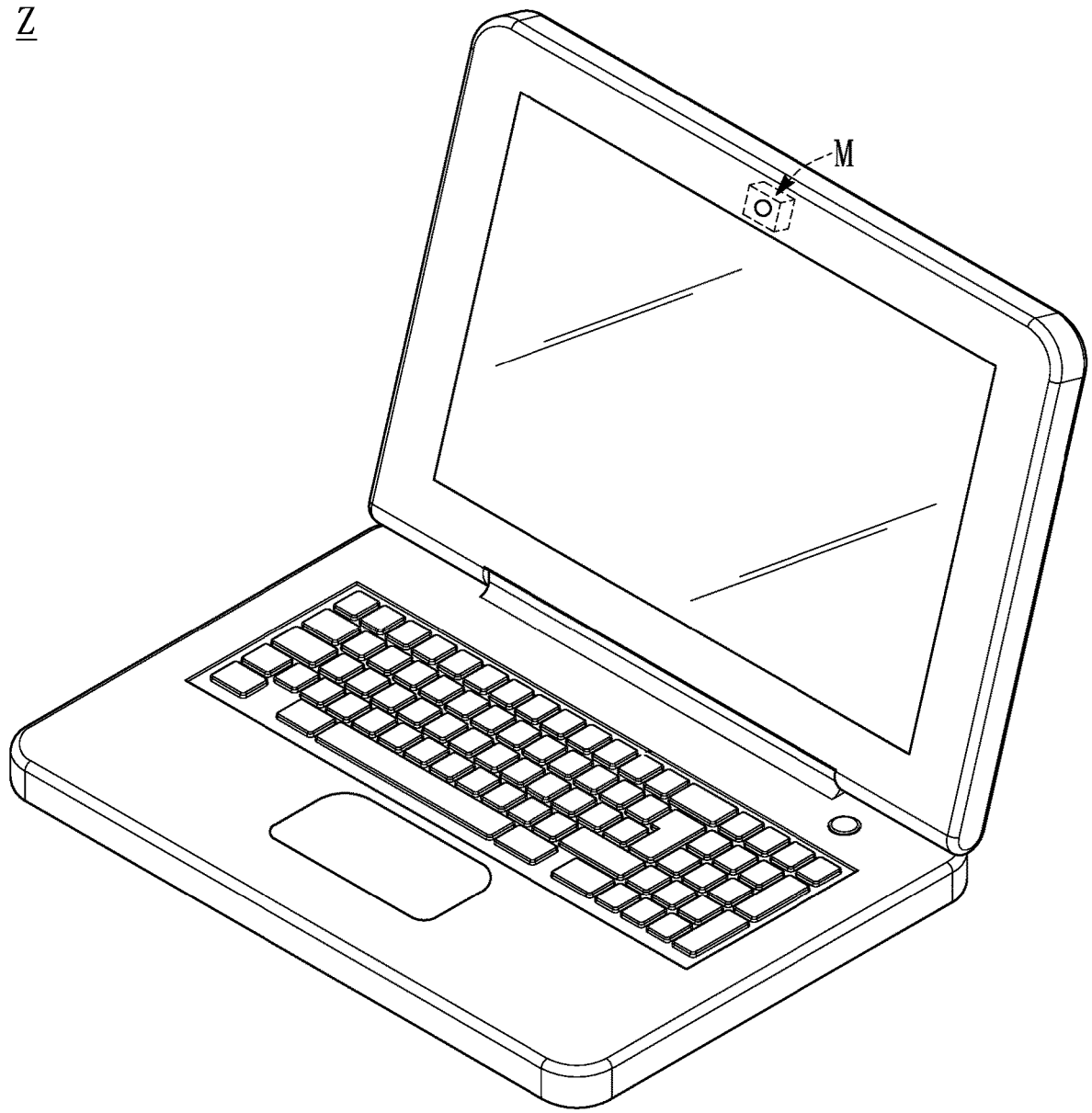
FIG. 3 shows a perspective schematic view of a portable electronic device according to the first embodiment of the present disclosure.

It should be noted that the first embodiment of the present disclosure further provides a portable electronic device Z using an image-capturing module M as shown in FIG. 1 and FIG. 3. For example, the portable electronic device Z may be a notebook computer, a tablet computer or a smart phone, but it is not meant to limit the scope of the present disclosure. In addition, the image-capturing module M includes a circuit substrate 1, an image-capturing chip 2, a plurality of first conductive materials 3, a filter component 4, a plurality of second conductive materials 5, and a lens assembly 6.

Second Embodiment

Figure 4:
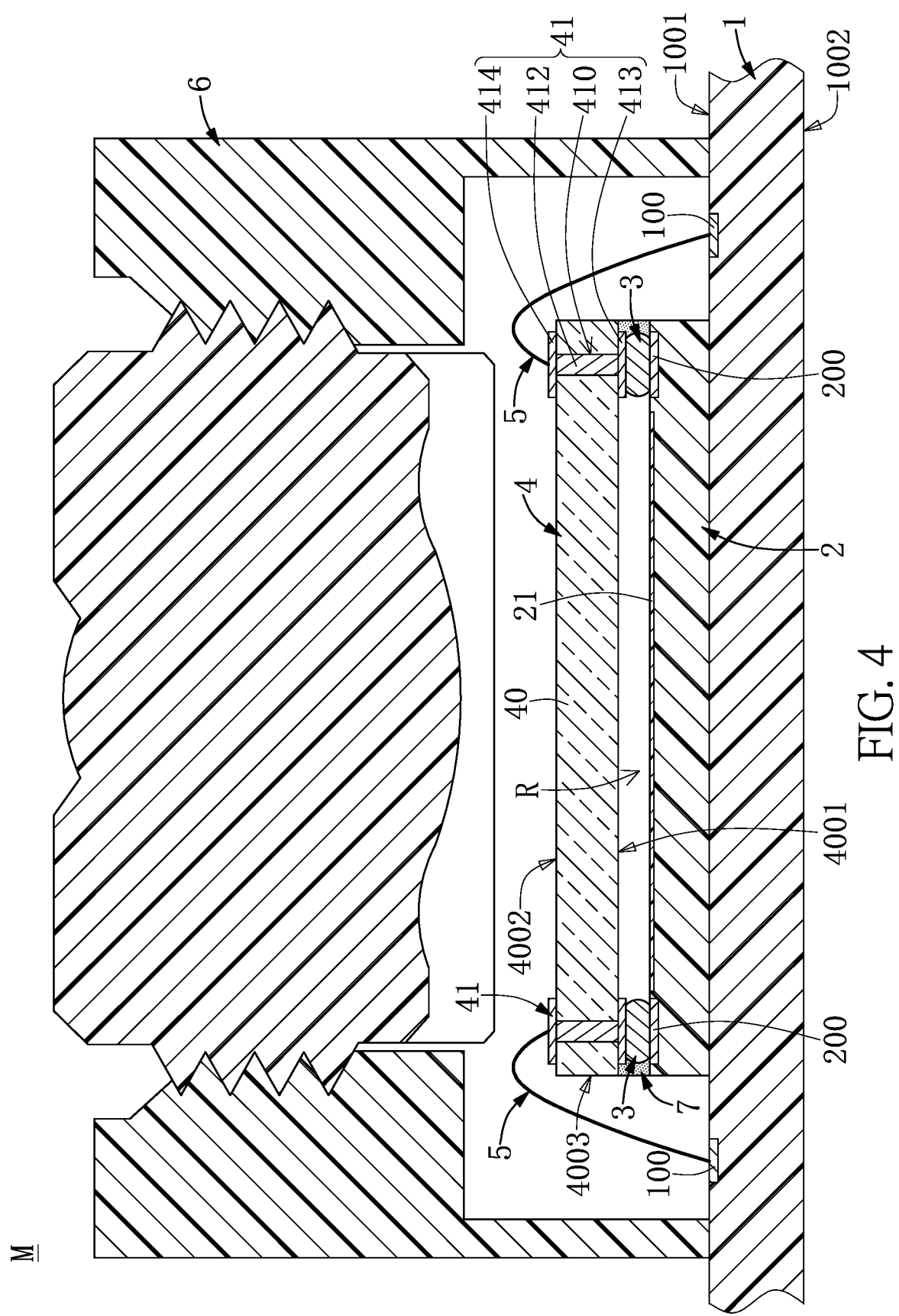
FIG. 4 is a lateral schematic view of an image-capturing module according to a second embodiment of the present disclosure.

Referring to FIG. 4, a second embodiment of the present disclosure provides an image-capturing module M and a portable electronic device (not shown) using the image-capturing module M. Comparing FIG. 4 with FIG. 1, the difference between the second embodiment and the first embodiment is as follows: in the second embodiment, each of the conductive structures 41 of the filter component 4 includes a through hole 410 passing through the light-transmitting body 40, a conductive penetration layer 412 disposed inside the through hole 410, a conductive bottom layer 413 disposed on a bottom side 4001 of the light-transmitting body 40, and a conductive top layer 414 disposed on a top side 4002 of the light-transmitting body 40. In addition, the conductive penetration layer 412 is disposed between the conductive bottom layer 413 and the conductive top layer 414, and the conductive bottom layer 413 and the conductive top layer 414 respectively electrically contact the corresponding first conductive material 3 and the corresponding second conductive material 5.

Therefore, in the second embodiment, a contact area between the conductive structure 41 and the first conductive material 3 can be increased due to the usage of the conductive bottom layer 413, so that the possibility of an open-circuit (such as a broken circuit due to loose contact or imperfect contact) between the conductive structure 41 and the first conductive material 3 can be decreased. Moreover, a contact area between the conductive structure 41 and the second conductive material 5 can be increased due to the usage of the conductive top layer 414, so that the possibility of an open-circuit (such as a broken circuit due to loose contact or imperfect contact) between the conductive structure 41 and the second conductive material 5 can be decreased.

Third Embodiment

Figure 5:
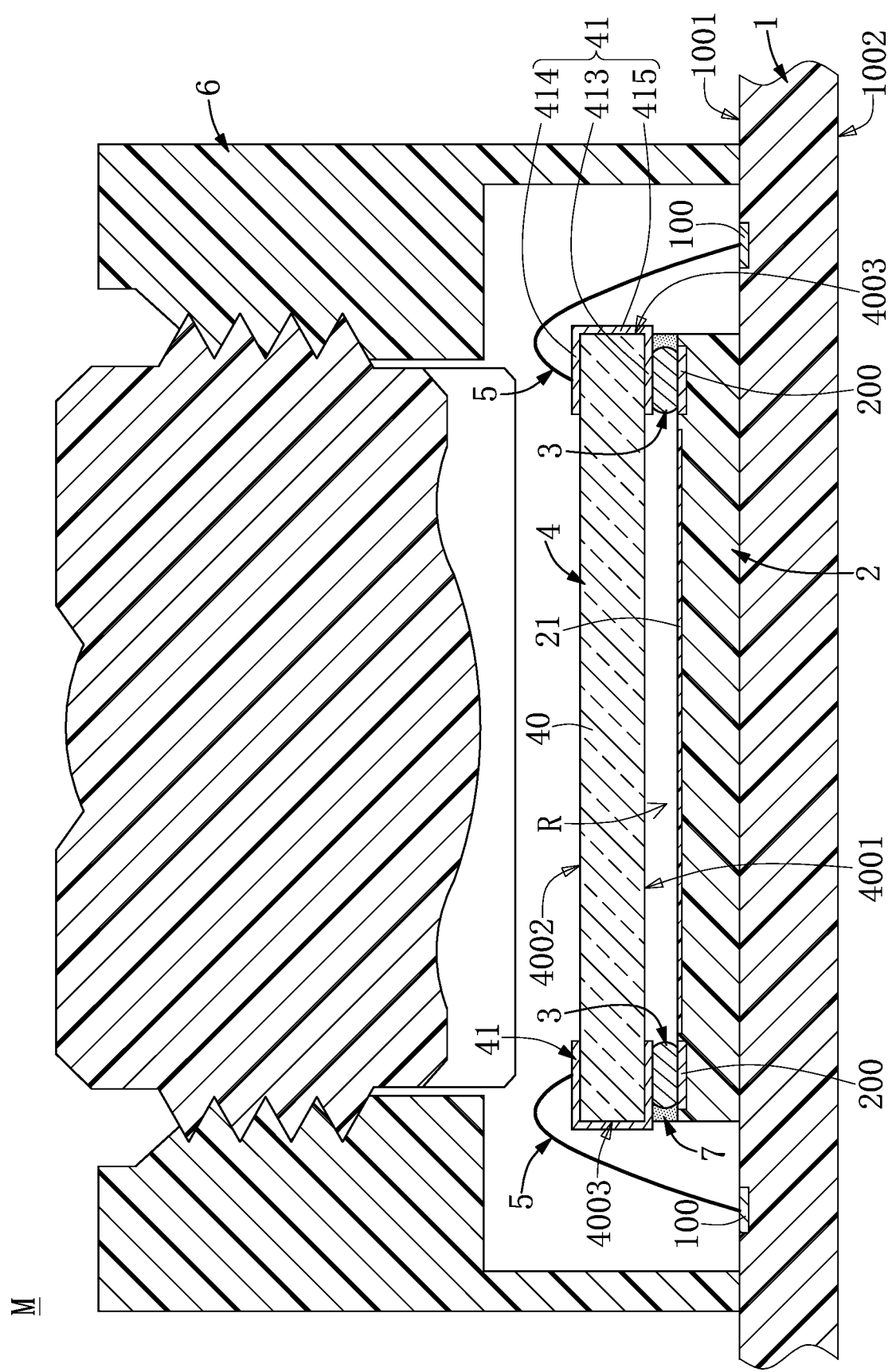
FIG. 5 is a lateral schematic view of an image-capturing module according to a third embodiment of the present disclosure.

Referring to FIG. 5, a third embodiment of the present disclosure provides an image-capturing module M and a portable electronic device (not shown) using the image-capturing module M. Comparing FIG. 5 with FIG. 1, the difference between the third embodiment and the first embodiment is as follows: in the third embodiment, each of the conductive structures 41 of the filter component 4 includes a conductive side layer 415 exposedly disposed on a lateral side 4003 of the light-transmitting body 40, a conductive bottom layer 413 disposed on a bottom side 4001 of the light-transmitting body 40, and a conductive top layer 414 disposed on a top side 4002 of the light-transmitting body 40. In addition, the conductive side layer 415 is disposed between the conductive bottom layer 413 and the conductive top layer 414, and the conductive bottom layer 413 and the conductive top layer 414 respectively electrically contact the corresponding first conductive material 3 and the corresponding second conductive material 5.

Therefore, in the third embodiment, a contact area between the conductive structure 41 and the first conductive material 3 can be increased due to the usage of the conductive bottom layer 413, so that the possibility of an open-circuit (such as a broken circuit due to loose contact or imperfect contact) between the conductive structure 41 and the first conductive material 3 can be decreased. Moreover, a contact area between the conductive structure 41 and the second conductive material 5 can be increased due to the usage of the conductive top layer 414, so that the possibility of an open-circuit (such as a broken circuit due to loose contact or imperfect contact) between the conductive structure 41 and the second conductive material 5 can be decreased. It should be noted that the conductive side layer 415 that is disposed between the conductive bottom layer 413 and the conductive top layer 414 can be disposed on the lateral side 4003 of the light-transmitting body 40, so that the light-transmitting body 40 has none of the through holes 410 of the first embodiment (that is to say, in the second embodiment, the light-transmitting body 40 can be used without the through holes 410 of the first embodiment). In addition, the second conductive material 5 can also be electrically connected between the conductive side layer 415 and the substrate bond pad 100.

Fourth Embodiment

Figure 6:
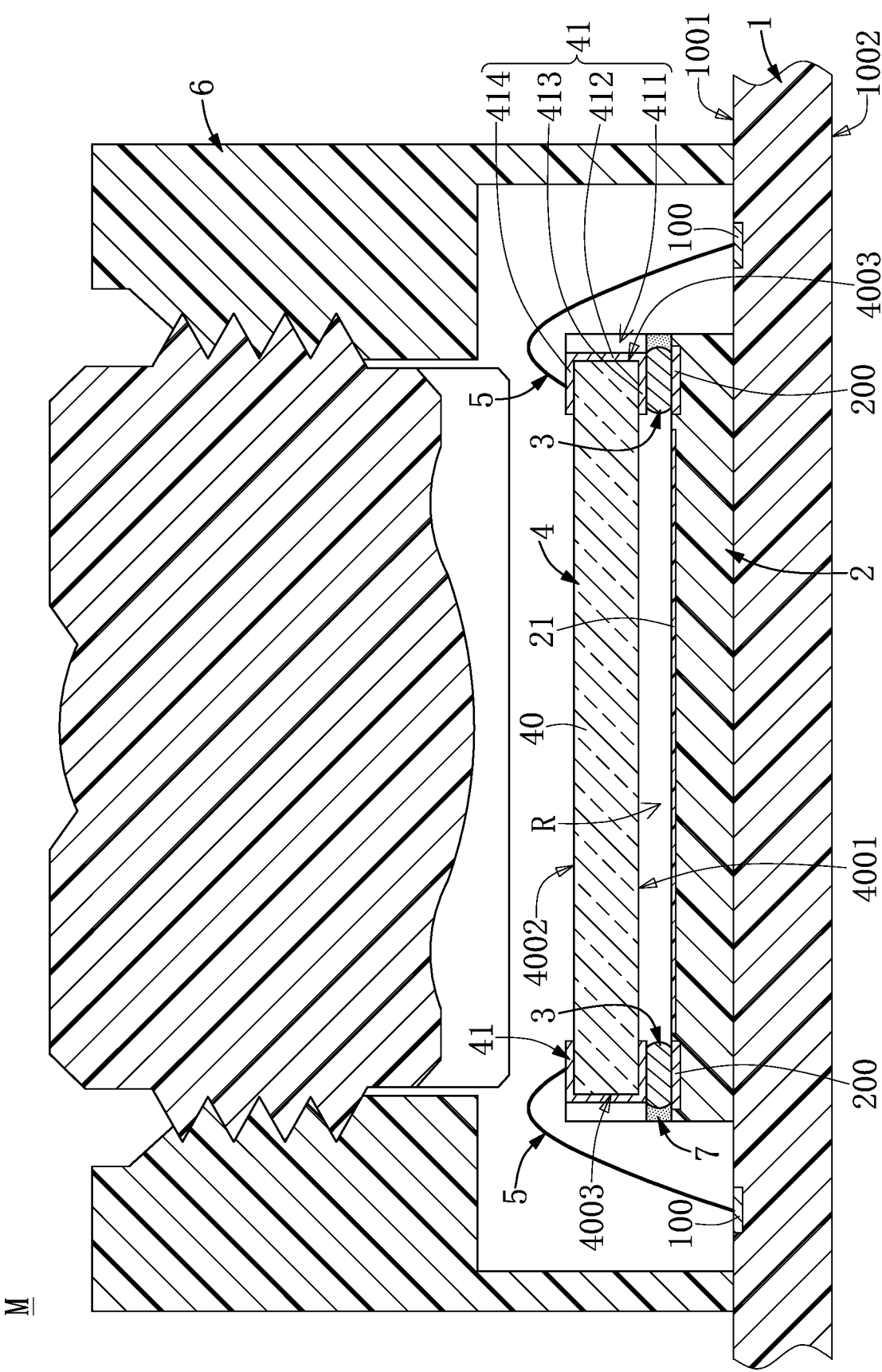
FIG. 6 is a lateral schematic view of an image-capturing module according to a fourth embodiment of the present disclosure.

Referring to FIG. 6, a fourth embodiment of the present disclosure provides an image-capturing module M and a portable electronic device (not shown) using the image-capturing module M. Comparing FIG. 6 with FIG. 1, the difference between the fourth embodiment and the first embodiment is as follows: in the fourth embodiment, each of the conductive structures 41 of the filter component 4 includes a half hole 411 disposed on a lateral side 4003 of the light-transmitting body 40, a conductive penetration layer 412 disposed inside the half hole 411, a conductive bottom layer 413 disposed on a bottom side 4001 of the light-transmitting body 40, and a conductive top layer 414 disposed on a top side 4002 of the light-transmitting body 40. In addition, the conductive penetration layer 412 is electrically connected between the conductive bottom layer 413 and the conductive top layer 414, and the conductive bottom layer 413 and the conductive top layer 414 respectively electrically contact the corresponding first conductive material 3 and the corresponding second conductive material 5.

Therefore, in the fourth embodiment, a contact area between the conductive structure 41 and the first conductive material 3 can be increased due to the usage of the conductive bottom layer 413, so that the possibility of an open-circuit (such as a broken circuit due to loose contact or imperfect contact) between the conductive structure 41 and the first conductive material 3 can be decreased. Moreover, a contact area between the conductive structure 41 and the second conductive material 5 can be increased due to the usage of the conductive top layer 414, so that the possibility of an open-circuit (such as a broken circuit due to loose contact or imperfect contact) between the conductive structure 41 and the second conductive material 5 can be decreased. It should be noted that the second conductive material 5 can also be electrically connected between the conductive penetration layer 412 and the substrate bond pad 100.

Fifth Embodiment

Figure 7:
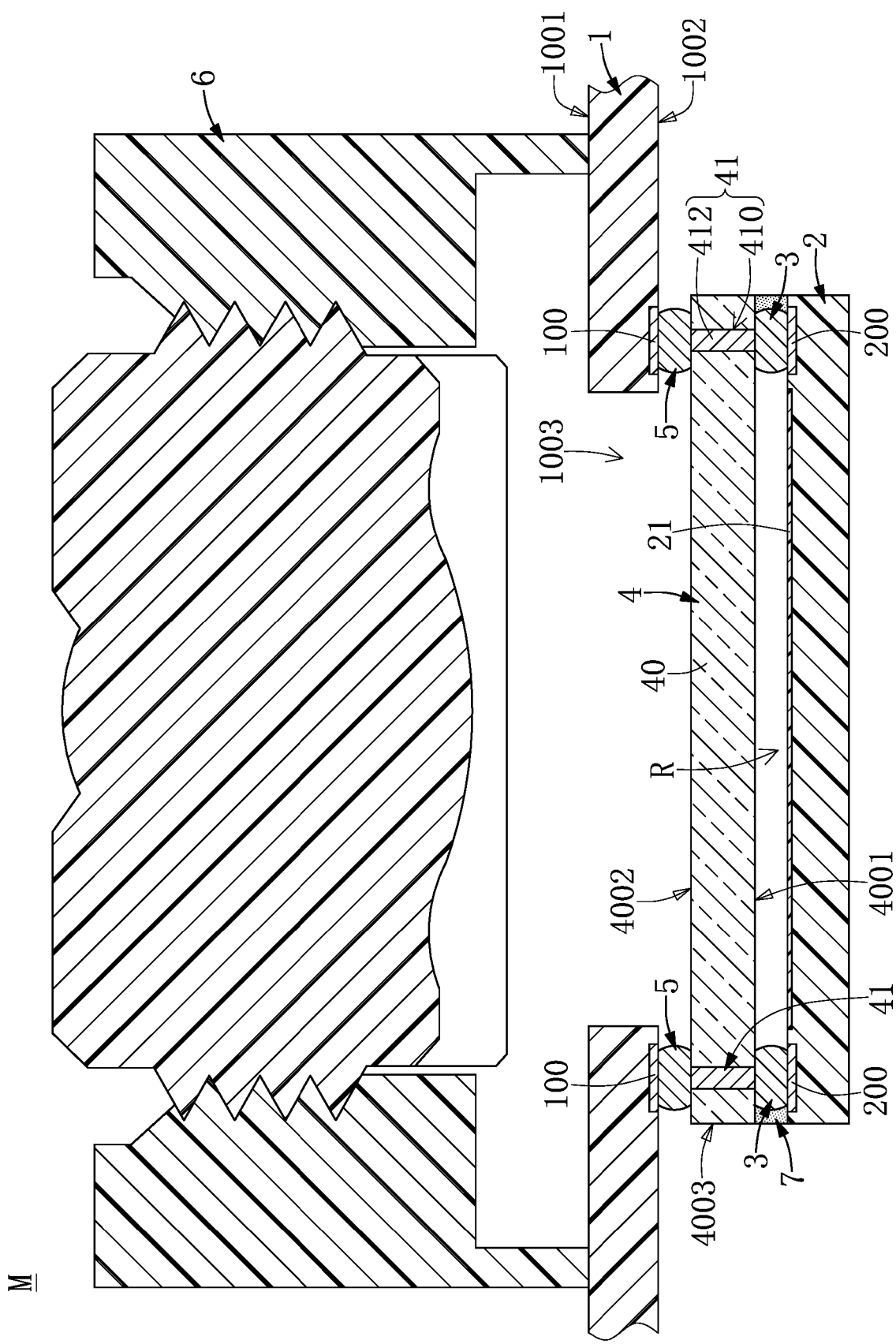
FIG. 7 is a lateral schematic view of an image-capturing module according to a fifth embodiment of the present disclosure.
Figure 8:
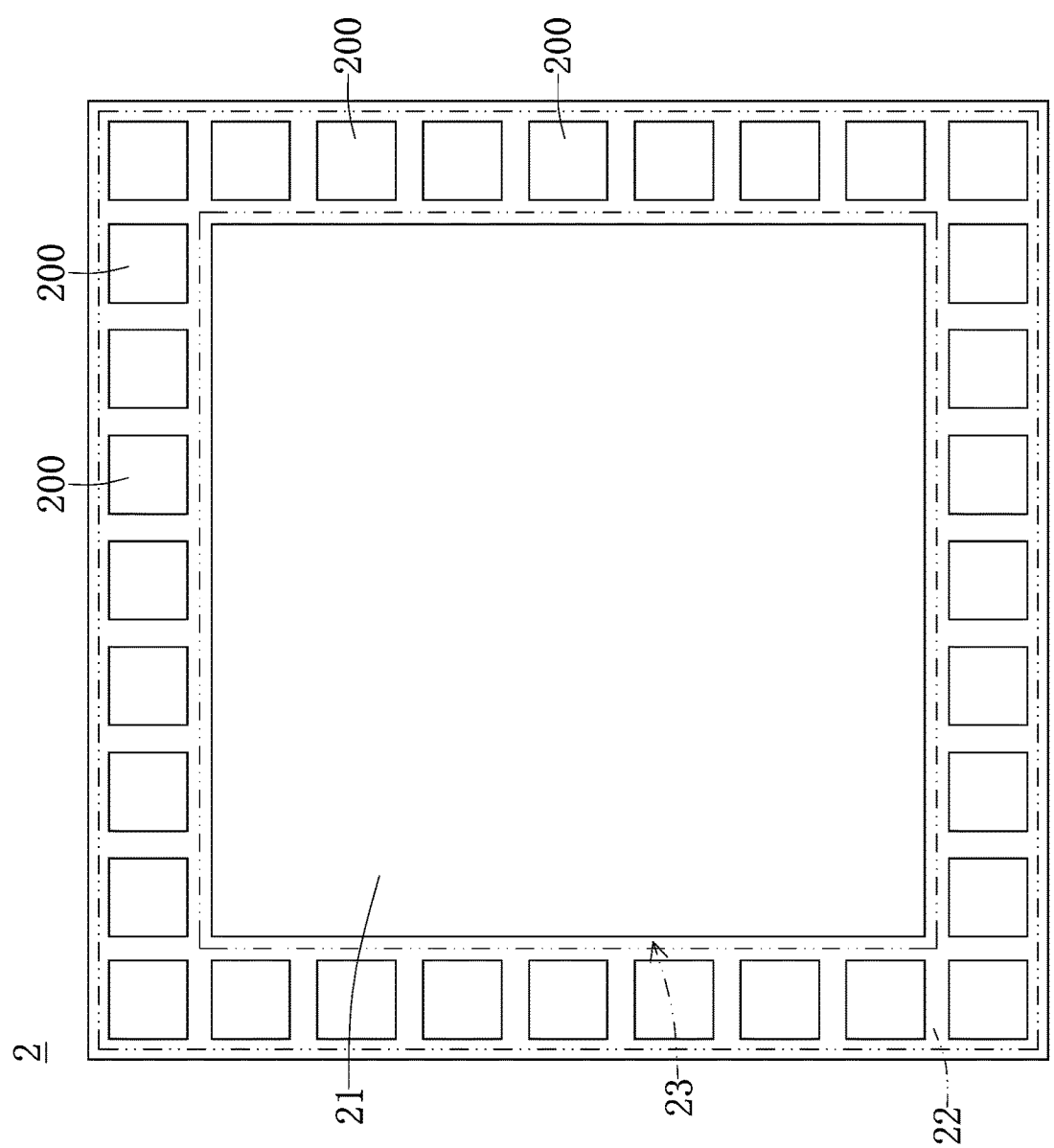
FIG. 8 is a top schematic view of an image-capturing chip according to the fifth embodiment of the present disclosure.

Referring to FIG. 7 and FIG. 8, a fifth embodiment of the present disclosure provides an image-capturing module M, including a circuit substrate 1, an image-capturing chip 2, a plurality of first conductive materials 3, a filter component 4, a plurality of second conductive materials 5, and a lens assembly 6. More particularly, the circuit substrate 1 includes a plurality of substrate bond pads 100 (such as solder pads), the image-capturing chip 2 includes a plurality of chip bond pads 200 (such as solder pads), and the first conductive materials 3 are respectively disposed on the chip bond pads 200 of the image-capturing chip 2. The filter component 4 is disposed on the first conductive materials 3. The filter component 4 includes a light-transmitting body 40 and a plurality of conductive structures 41 disposed on the light-transmitting body 40 and respectively electrically connected to the first conductive materials 3. Each of the second conductive materials 5 is electrically connected between the corresponding conductive structure 41 and the corresponding substrate bond pads 100, and the lens assembly 6 is disposed on the circuit substrate 1 so as to correspond to the image-capturing chip 2.

For example, as shown in FIG. 7, the circuit substrate 1 has a top surface 1001, a bottom surface 1002 opposite to the top surface 1001, and a through opening 1003 connected between the top surface 1001 and the bottom surface 1002 for passing through the circuit substrate 1. The substrate bond pads 100 can be disposed on the bottom surface 1002 of the circuit substrate 1, and the second conductive materials 5 can be respectively disposed on the substrate bond pads 100. In addition, each of the first conductive materials 3 may be a first conductive body (such as solder ball, solder paste or any type of conductive material) electrically connected between the corresponding chip bond pad 200 and the corresponding conductive structure 41, and each of the second conductive materials 5 may be a second conductive body (such as solder ball, solder paste or any type of conductive material) electrically connected between the corresponding conductive structure 41 and the corresponding substrate bond pad 100. However, the aforementioned description is merely an example and is not meant to limit the scope of the present disclosure.

For example, as shown in FIG. 7, each of the conductive structures 41 of the filter component 4 (such as an optical filter) includes a through hole 410 passing through the light-transmitting body 40 and a conductive penetration layer 412 disposed inside the through hole 410 (so that the through hole 410 can be fully filled by the conductive penetration layer 412), and the conductive penetration layer 412 has two opposite ends respectively electrically contacting the corresponding first conductive material 3 and the corresponding second conductive material 5. However, the aforementioned description is merely an example and is not meant to limit the scope of the present disclosure.

For example, referring to FIG. 7 and FIG. 8, the image-capturing chip 2 may be a complementary metal-oxide-semiconductor (CMOS) chip or a charge-coupled device (CCD). In addition, the image-capturing chip 2 has an image-sensing region 21 and a chip pad region 22 for carrying pads, and an unoccupied region 23 (or an unoccupied space) is located between the image-sensing region 21 and the chip pad region 22. That is to say, the filter component 4 can be supported by the first conductive materials 3, and there is not any support body disposed on the unoccupied region 23 (that is a surrounding slot region located between the image-sensing region 21 and the surrounding chip pad region 22) for supporting the filter component 4, so that a sensing area of the image-sensing region 21 can be increased or maximized due to the unoccupied region 23 that is minimized. Moreover, the chip bond pads 200 are disposed on the chip pad region 22, and the image-sensing region 21 is surrounded by the chip pad region 21, so that the image-sensing region 21 can be surrounded by the chip bond pads 200. However, the afore-mentioned description is merely an example and is not meant to limit the scope of the present disclosure.

For example, as shown in FIG. 7, it should be noted that the image-capturing module M further includes an insulating filling material 7, and the insulating filling material 7 can be disposed between the image-capturing chip 2 and the filter component 4 for surrounding the first conductive materials 3 so as to form an enclosed space R between the image-capturing chip 2 and the filter component 4. Therefore, the insulating filling material 7 can be used to prevent the chip pad region 21 of the image-capturing chip 2 from being polluted by external particles or dust. However, the aforementioned description is merely an example and is not meant to limit the scope of the present disclosure.

Figure 9:
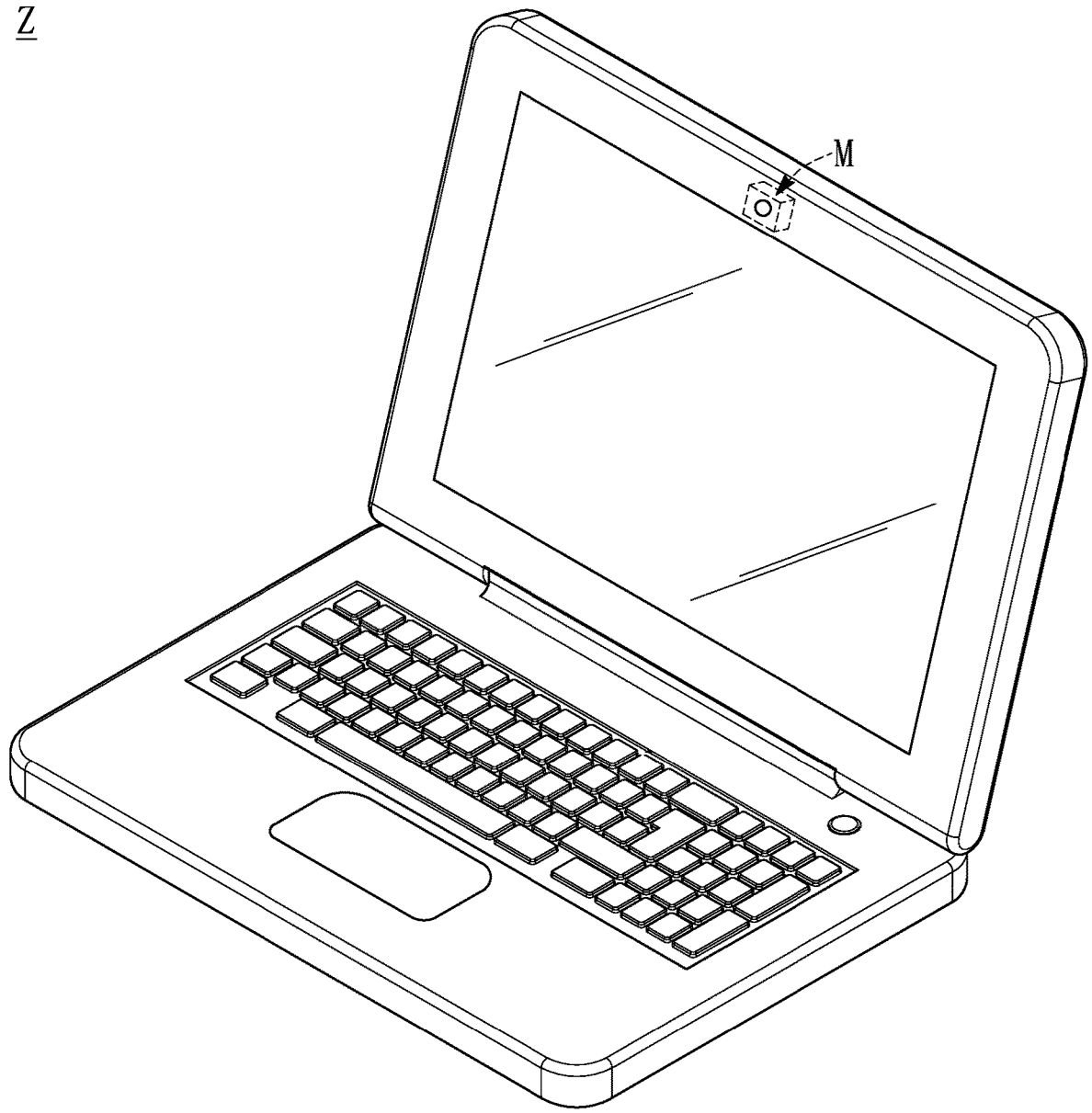
FIG. 9 shows a perspective schematic view of a portable electronic device according to the fifth embodiment of the present disclosure.

It should be noted that the fourth embodiment of the present disclosure further provides a portable electronic device Z using an image-capturing module M as shown in FIG. 7 and FIG. 9. For example, the portable electronic device Z may be a notebook computer, a tablet computer or a smart phone, but it is not meant to limit the scope of the present disclosure. In addition, the image-capturing module M includes a circuit substrate 1, an image-capturing chip 2, a plurality of first conductive materials 3, a filter component 4, a plurality of second conductive materials 5, and a lens assembly 6.

Sixth Embodiment

Figure 10:
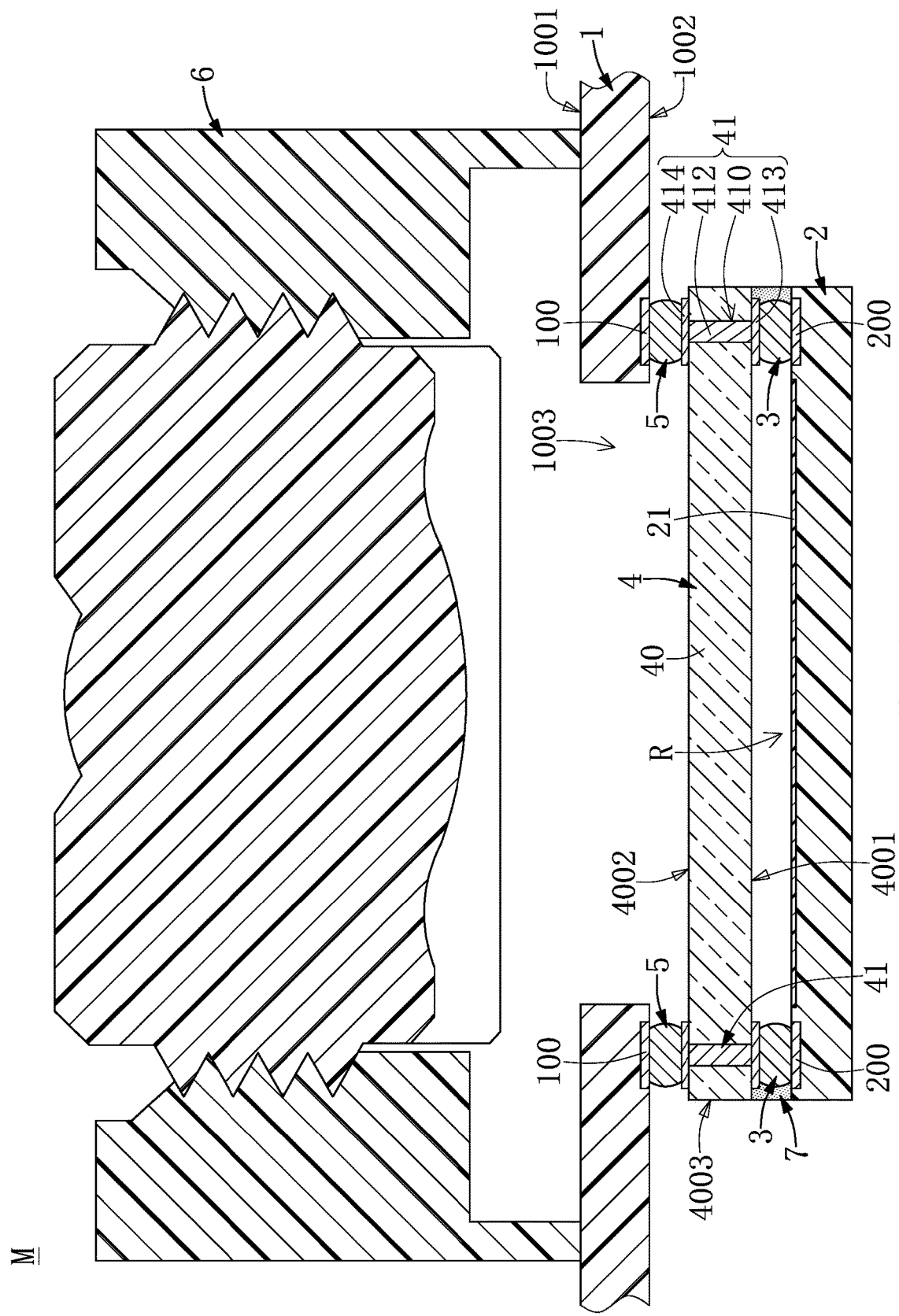
FIG. 10 is a lateral schematic view of an image-capturing module according to a sixth embodiment of the present disclosure.

Referring to FIG. 10, a sixth embodiment of the present disclosure provides an image-capturing module M and a portable electronic device (not shown) using the image-capturing module M. Comparing FIG. 10 with FIG. 7, the difference between the sixth embodiment and the fifth embodiment is as follows: in the sixth embodiment, each of the conductive structures 41 of the filter component 4 includes a through hole 410 passing through the light-transmitting body 40, a conductive penetration layer 412 disposed inside the through hole 410, a conductive bottom layer 413 disposed on a bottom side 4001 of the light-transmitting body 40, and a conductive top layer 414 disposed on a top side 4002 of the light-transmitting body 40. In addition, the conductive penetration layer 412 is disposed between the conductive bottom layer 413 and the conductive top layer 414, and the conductive bottom layer 413 and the conductive top layer 414 respectively electrically contact the corresponding first conductive material 3 and the corresponding second conductive material 5.

Therefore, in the sixth embodiment, a contact area between the conductive structure 41 and the first conductive material 3 can be increased due to the usage of the conductive bottom layer 413, so that the possibility of an open-circuit (such as a broken circuit due to loose contact or imperfect contact) between the conductive structure 41 and the first conductive material 3 can be decreased. Moreover, a contact area between the conductive structure 41 and the second conductive material 5 can be increased due to the usage of the conductive top layer 414, so that the possibility of an open-circuit (such as a broken circuit due to loose contact or imperfect contact) between the conductive structure 41 and the second conductive material 5 can be decreased.

Seventh Embodiment

Figure 11:
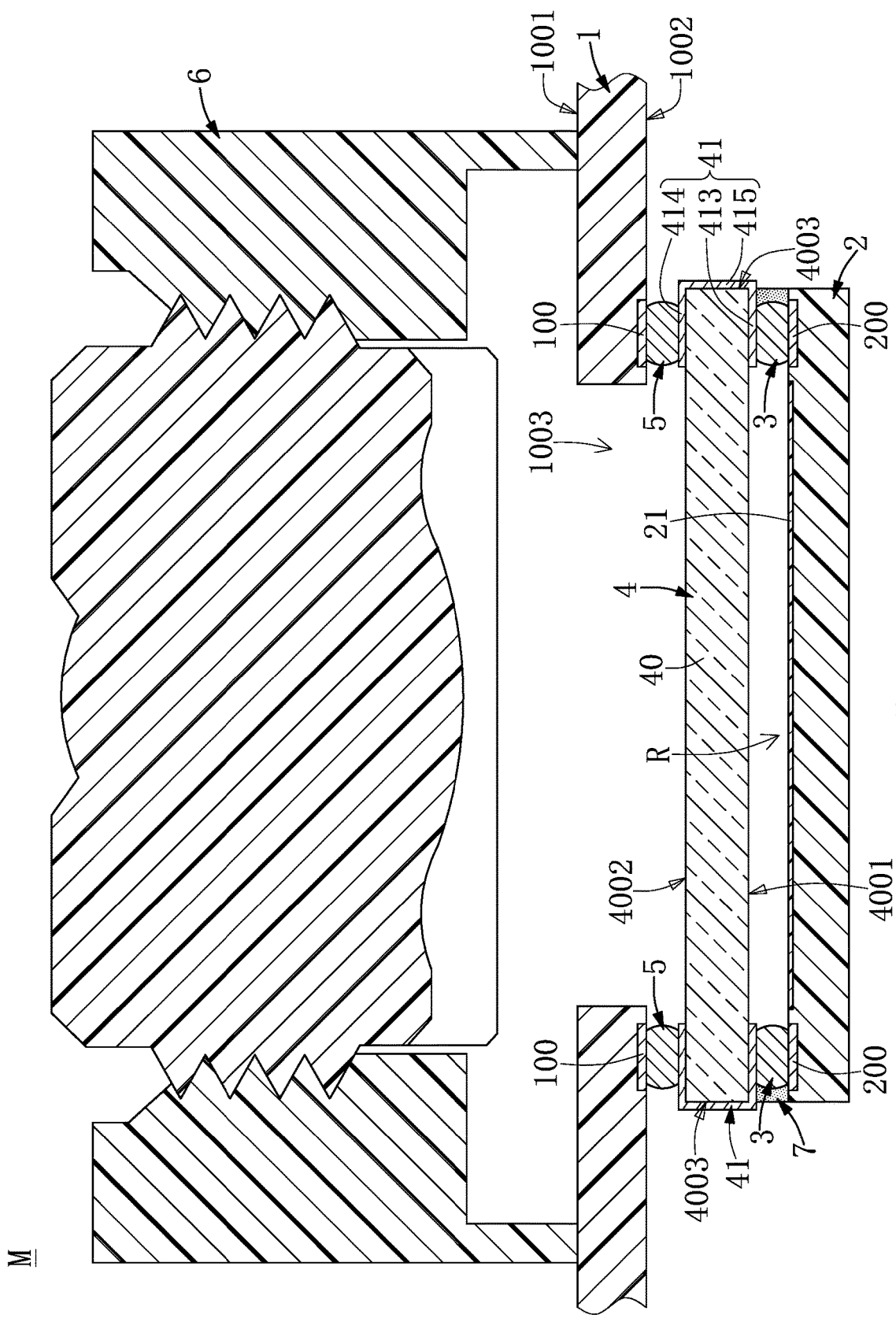
FIG. 11 is a lateral schematic view of an image-capturing module according to a seventh embodiment of the present disclosure.

Referring to FIG. 11, a seventh embodiment of the present disclosure provides an image-capturing module M and a portable electronic device (not shown) using the image-capturing module M. Comparing FIG. 11 with FIG. 7, the difference between the seventh embodiment and the fifth embodiment is as follows: in the seventh embodiment, each of the conductive structures 41 of the filter component 4 includes a conductive side layer 415 exposedly disposed on a lateral side 4003 of the light-transmitting body 40, a conductive bottom layer 413 disposed on a bottom side 4001 of the light-transmitting body 40, and a conductive top layer 414 disposed on a top side 4002 of the light-transmitting body 40. In addition, the conductive side layer 415 is disposed between the conductive bottom layer 413 and the conductive top layer 414, and the conductive bottom layer 413 and the conductive top layer 414 respectively electrically contact the corresponding first conductive material 3 and the corresponding second conductive material 5.

Therefore, in the seventh embodiment, a contact area between the conductive structure 41 and the first conductive material 3 can be increased due to the usage of the conductive bottom layer 413, so that the possibility of an open-circuit (such as a broken circuit due to loose contact or imperfect contact) between the conductive structure 41 and the first conductive material 3 can be decreased. Moreover, a contact area between the conductive structure 41 and the second conductive material 5 can be increased due to the usage of the conductive top layer 414, so that the possibility of an open-circuit (such as a broken circuit due to loose contact or imperfect contact) between the conductive structure 41 and the second conductive material 5 can be decreased. It should be noted that the conductive side layer 415 that is disposed between the conductive bottom layer 413 and the conductive top layer 414 can be disposed on the lateral side 4003 of the light-transmitting body 40, so that the light-transmitting body 40 has none of the through holes 410 of the fifth embodiment (that is to say, in the second embodiment, the light-transmitting body 40 can be used without the through holes 410 of the first embodiment). In addition, the second conductive material 5 can also be electrically connected between the conductive side layer 415 and the substrate bond pad 100.

Eighth Embodiment

Figure 12:
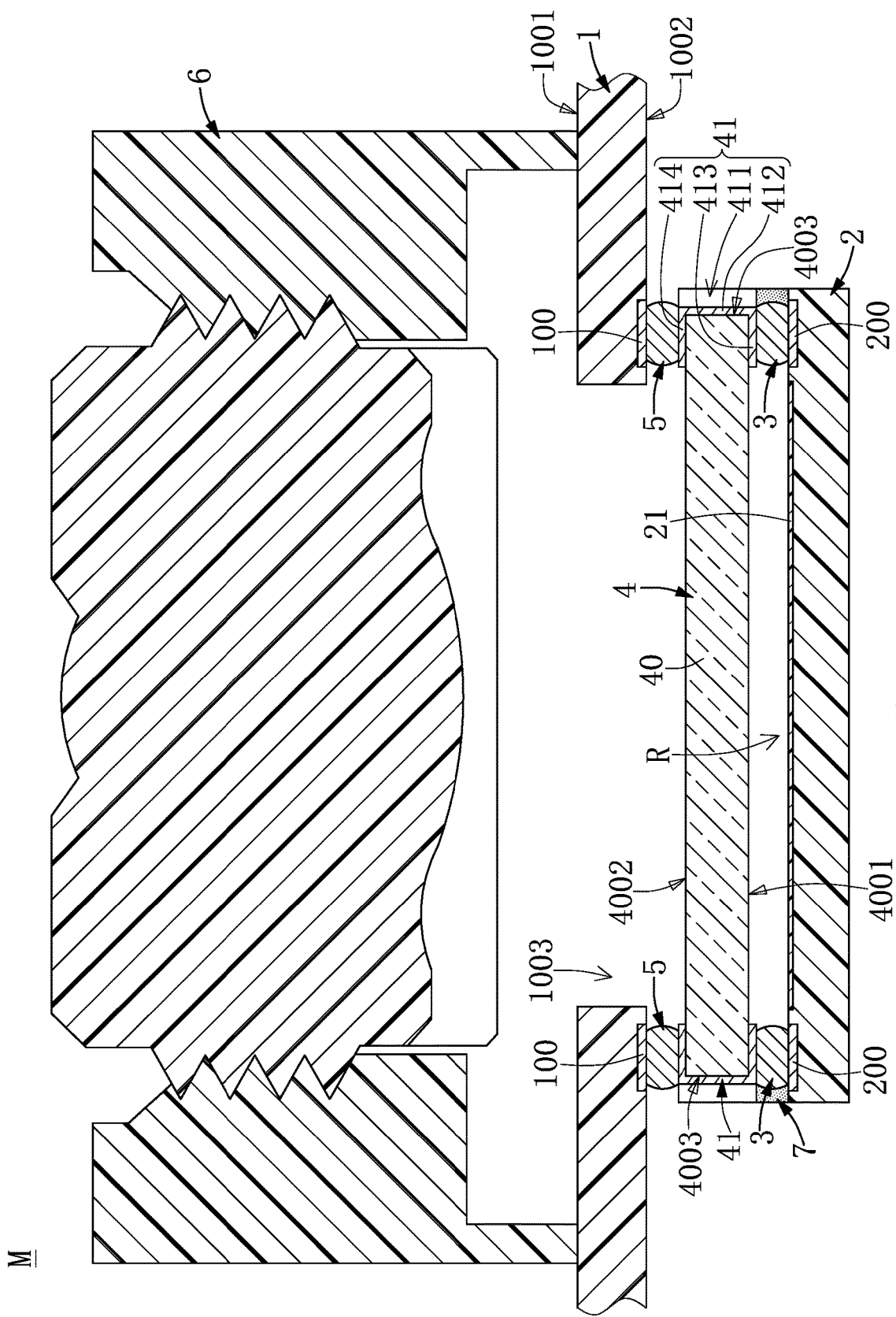
FIG. 12 is a lateral schematic view of an image-capturing module according to an eighth embodiment of the present disclosure.

Referring to FIG. 12, an eighth embodiment of the present disclosure provides an image-capturing module M and a portable electronic device (not shown) using the image-capturing module M. Comparing FIG. 12 with FIG. 7, the difference between the eighth embodiment and the fifth embodiment is as follows: in the eighth embodiment, each of the conductive structures 41 of the filter component 4 includes a half hole 411 disposed on a lateral side 4003 of the light-transmitting body 40, a conductive penetration layer 412 disposed inside the half hole 411, a conductive bottom layer 413 disposed on a bottom side 4001 of the light-transmitting body 40, and a conductive top layer 414 disposed on a top side 4002 of the light-transmitting body 40. In addition, the conductive penetration layer 412 is electrically connected between the conductive bottom layer 413 and the conductive top layer 414, and the conductive bottom layer 413 and the conductive top layer 414 respectively electrically contact the corresponding first conductive material 3 and the corresponding second conductive material 5.

Therefore, in the eighth embodiment, a contact area between the conductive structure 41 and the first conductive material 3 can be increased due to the usage of the conductive bottom layer 413, so that the possibility of an open-circuit (such as a broken circuit due to loose contact or imperfect contact) between the conductive structure 41 and the first conductive material 3 can be decreased. Moreover, a contact area between the conductive structure 41 and the second conductive material 5 can be increased due to the usage of the conductive top layer 414, so that the possibility of an open-circuit (such as a broken circuit due to loose contact or imperfect contact) between the conductive structure 41 and the second conductive material 5 can be decreased. It should be noted that the second conductive material 5 can also be electrically connected between the conductive penetration layer 412 and the substrate bond pad 100.

In conclusion, by virtue of "the first conductive materials 3 being respectively disposed on the chip bond pads 200 of the image-capturing chip 2", "the filter component 4 being disposed on the first conductive materials 3, and the filter component 4 including a light-transmitting body 40 and a plurality of conductive structures 41 disposed on the light-transmitting body 40 and respectively electrically connected to the first conductive materials 3" and "each of the second conductive materials 5 being electrically connected between the corresponding conductive structure 41 and the corresponding substrate bond pads 100", the filter component 4 can not only be electrically connected to the chip bond pads 200 of the image-capturing chip 2 through the cooperation of the conductive structures 41 and the first conductive materials 3, but can also be supported above the image-capturing chip 2 by the first conductive materials 3 that are respectively disposed on the chip bond pads 200. Therefore, the area of the image-sensing region 21 of the image-capturing chip 2 can be maximized so as to increase the sensing area of the image-sensing region 21.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image-capturing module, comprising:
    a circuit substrate including a plurality of substrate bond pads;
    an image-capturing chip including a plurality of chip bond pads;
    a plurality of first conductive materials respectively disposed on the chip bond pads of the image-capturing chip;
    a filter component disposed on the first conductive materials, wherein the filter component includes a light-transmitting body and a plurality of conductive structures disposed on the light-transmitting body and respectively electrically connected to the first conductive materials;
    a plurality of second conductive materials each electrically connected between the corresponding conductive structure and the corresponding substrate bond pads; and
    a lens assembly disposed on the circuit substrate so as to correspond to the image-capturing chip;

wherein each of the conductive structures of the filter component includes a conductive side layer exposedly disposed on a lateral side of the light-transmitting body, a conductive bottom layer disposed on a bottom side of the light-transmitting body, and a conductive top layer disposed on a top side of the light-transmitting body, the conductive side layer is disposed between the conductive bottom layer and the conductive top layer, and the conductive bottom layer and the conductive top layer respectively electrically contact the corresponding first conductive material and the corresponding second conductive material.

2. The image-capturing module according to claim 1, wherein the circuit substrate has a top surface and a bottom surface opposite to the top surface, the image-capturing chip is disposed on the top surface of the circuit substrate, and the substrate bond pads are disposed on the top surface of the circuit substrate; wherein each of the first conductive materials is a conductive body electrically connected between the corresponding chip bond pad and the corresponding conductive structure, and each of the second conductive materials is a conductive wire electrically connected between the corresponding conductive structure and the corresponding substrate bond pad; wherein the image-capturing chip has an image-sensing region and a chip pad region, and an unoccupied region is located between the image-sensing region and the chip pad region; wherein the chip bond pads are disposed on the chip pad region, and the image-sensing region is surrounded by the chip pad region, so that the image-sensing region is surrounded by the chip bond pads; wherein the image-capturing module includes an insulating filling material, and the insulating filling material is disposed between the image-capturing chip and the filter component for surrounding the first conductive materials so as to form an enclosed space between the image-capturing chip and the filter component.

3. The image-capturing module according to claim 1, wherein the circuit substrate has a top surface and a bottom surface opposite to the top surface, the image-capturing chip is disposed on the top surface of the circuit substrate, and the substrate bond pads are disposed on the top surface of the circuit substrate; wherein each of the first conductive materials is a conductive body electrically connected between the corresponding chip bond pad and the corresponding conductive structure, and each of the second conductive materials is a conductive wire electrically connected between the corresponding conductive structure and the corresponding substrate bond pad; wherein each of the conductive structures of the filter component includes a half hole and the lateral side of the light-transmitting body and the conductive side layer are disposed inside the half hole wherein the image-capturing chip has an image-sensing region and a chip pad region, and an unoccupied region is located between the image-sensing region and the chip pad region; wherein the chip bond pads are disposed on the chip pad region, and the image-sensing region is surrounded by the chip pad region, so that the image-sensing region is surrounded by the chip bond pads; wherein the image-capturing module includes an insulating filling material, and the insulating filling material is disposed between the image-capturing chip and the filter component for surrounding the first conductive materials so as to form an enclosed space between the image-capturing chip and the filter component.

4. The image-capturing module according to claim 1, wherein the circuit substrate has a top surface, a bottom surface opposite to the top surface, and a through opening connected between the top surface and the bottom surface, the substrate bond pads are disposed on the bottom surface of the circuit substrate, and the second conductive materials are respectively disposed on the substrate bond pads; wherein each of the first conductive materials is a first conductive body electrically connected between the corresponding chip bond pad and the corresponding conductive structure, and each of the second conductive materials is a second conductive body electrically connected between the corresponding conductive structure and the corresponding substrate bond pad; wherein the image-capturing chip has an image-sensing region and a chip pad region, and an unoccupied region is located between the image-sensing region and the chip pad region; wherein the chip bond pads are disposed on the chip pad region, and the image-sensing region is surrounded by the chip pad region, so that the image-sensing region is surrounded by the chip bond pads; wherein the image-capturing module includes an insulating filling material, and the insulating filling material is disposed between the image-capturing chip and the filter component for surrounding the first conductive materials so as to form an enclosed space between the image-capturing chip and the filter component.

5. The image-capturing module according to claim 1, wherein the circuit substrate has a top surface, a bottom surface opposite to the top surface, and a through opening connected between the top surface and the bottom surface, the substrate bond pads are disposed on the bottom surface of the circuit substrate, and the second conductive materials are respectively disposed on the substrate bond pads; wherein each of the first conductive materials is a first conductive body electrically connected between the corresponding chip bond pad and the corresponding conductive structure, and each of the second conductive materials is a second conductive body electrically connected between the corresponding conductive structure and the corresponding substrate bond pad; wherein each of the conductive structures of the filter component includes a half hole, and the lateral side of the light-transmitting body and the conductive side layer are disposed inside the half hole wherein the image-capturing chip has an image-sensing region and a chip pad region, and an unoccupied region is located between the image-sensing region and the chip pad region; wherein the chip bond pads are disposed on the chip pad region, and the image-sensing region is surrounded by the chip pad region, so that the image-sensing region is surrounded by the chip bond pads; wherein the image-capturing module includes an insulating filling material, and the insulating filling material is disposed between the image-capturing chip and the filter component for surrounding the first conductive materials so as to form an enclosed space between the image-capturing chip and the filter component.

6. A portable electronic device using an image-capturing module, wherein the image-capturing module comprises:
   a circuit substrate including a plurality of substrate bond pads;
   an image-capturing chip including a plurality of chip bond pads;
   a plurality of first conductive materials respectively disposed on the chip bond pads of the image-capturing chip;
   a filter component disposed on the first conductive materials, wherein the filter component includes a light-transmitting body and a plurality of conductive structures disposed on the light-transmitting body and respectively electrically connected to the first conductive materials;

a plurality of second conductive materials each electrically connected between the corresponding conductive structure and the corresponding substrate bond pads; and a lens assembly disposed on the circuit substrate so as to correspond to the image-capturing chip;

wherein each of the conductive structures of the filter component includes a conductive side layer exposedly disposed on a lateral side of the light-transmitting body, a conductive bottom layer disposed on a bottom side of the light-transmitting body, and a conductive top layer disposed on a top side of the light-transmitting body, the conductive side layer is disposed between the conductive bottom layer and the conductive top layer, and the conductive bottom layer and the conductive top layer respectively electrically contact the corresponding first conductive material and the corresponding second conductive material.

* * * * *